US007086141B2

(12) United States Patent
Tsuchiya et al.

(10) Patent No.: US 7,086,141 B2
(45) Date of Patent: Aug. 8, 2006

(54) MANUFACTURING METHOD OF MAGNETORESISTIVE EFFECT SENSOR

(75) Inventors: Yoshihiro Tsuchiya, Tokyo (JP); Tetsuro Sasaki, Tokyo (JP)

(73) Assignee: TDK Corporation, Tokyo (JP)

( * ) Notice: Subject to any disclaimer, the term of this patent is extended or adjusted under 35 U.S.C. 154(b) by 52 days.

(21) Appl. No.: 10/175,364

(22) Filed: Jun. 20, 2002

(65) Prior Publication Data
US 2003/0005575 A1    Jan. 9, 2003

(30) Foreign Application Priority Data
Jun. 25, 2001    (JP) ............... 2001-191417

(51) Int. Cl.
*G11B 5/127*    (2006.01)
*H04R 31/00*    (2006.01)

(52) U.S. Cl. ............... 29/603.14; 29/603.07; 29/603.09; 29/603.13; 216/22; 216/38; 216/78; 360/324.11; 360/324.12; 427/127; 427/128; 427/129; 427/130; 427/131

(58) Field of Classification Search ............ 29/603.07, 29/603.09, 603.13, 603.14; 360/324.1, 324.11, 360/324.12; 427/127–131, 299, 307, 331, 427/402, 444; 216/22, 38, 78
See application file for complete search history.

(56) References Cited

U.S. PATENT DOCUMENTS 6,042,929 A * 3/2000 Burke et al. ............... 428/141
6,134,090 A * 10/2000 Mao et al. ............... 360/324.1
6,348,274 B1   2/2002 Kamiguchi et al.
6,589,337 B1 * 7/2003 Hisada et al. ............ 117/95
6,661,622 B1 * 12/2003 Pinarbasi ............... 360/324.1
6,686,068 B1 * 2/2004 Carey et al. ............... 428/692

FOREIGN PATENT DOCUMENTS

| JP | 11-354859 | 12/1999 |
| JP | 2000-106464 A | 4/2000 |
| JP | 2000307171 A * | 11/2000 |
| JP | 2001-068760 A | 3/2001 |
| JP | 2001-076479 A | 3/2001 |
| JP | 2001-094173 A | 4/2001 |
| JP | 2001-156357 A | 6/2001 |
| JP | 2002-124718 | 4/2002 |

OTHER PUBLICATIONS

"Specularity in GMR spin valves and in situ electrical and magnetotransport measurements"; Wang, S.X.; Yamada, K.; Bailey, W.E.; Magnetics, IEEE Transactions on , vol.: 36 , Issue: 5 , Sep. 2000; pp. 2841-2846.*

(Continued)

*Primary Examiner*—Paul D. Kim
(74) *Attorney, Agent, or Firm*—Armstrong, Kratz, Quintos, Hanson & Brooks, LLP

(57) ABSTRACT

A manufacturing method of an MR sensor including a step of stacking an anti-ferromagnetic layer made of an electrically conductive anti-ferromagnetic material, a step of stacking a pinned layer on the anti-ferromagnetic layer, a step of stacking a nonmagnetic spacer layer on the pinned layer, a step of exposing at least once a surface of the nonmagnetic spacer layer to an oxygen-contained atmosphere, a step of stacking a free layer on the nonmagnetic spacer layer, a magnetization direction of the free layer being free depending upon a magnetic filed applied thereto, and a step of providing the pinned layer a magnetization direction fixed by an exchange coupling between the anti-ferromagnetic layer and the pinned layer.

3 Claims, 10 Drawing Sheets

OTHER PUBLICATIONS

W. F. Egelhoff, et al., "Oxygen as a surfactant in the growth of giant magnetoresistance spin valves", J. Appl. Phys. 82 (12), pp. 6142-6151, (1997).

E. Makino et al.; "Reduction of Interlayer Coupling in Bottom Synthetic Spin Valves Through a Gas Exposure Process"; Journal of Applied Physics, vol. 89, No. 11, Jun. 1, 2001.

* cited by examiner

MANUFACTURING METHOD OF MAGNETORESISTIVE EFFECT SENSOR

BACKGROUND OF THE INVENTION

1. Field of the Invention

The present invention relates to a manufacturing method of a magnetoresistive effect (MR) sensor using a giant magnetoresistive effect (GMR) or a tunneling magnetoresistive effect (TMR), and to a manufacturing method of a thin-film magnetic head with the MR sensor, used for a magnetic recording and reproducing unit such as an HDD (Hard Disk Drive) unit or FDD (Floppy Disk Drive) unit for example.

2. Description of the Related Art

Recently, thin-film magnetic heads with MR sensors based on a spin valve effect (SV) of GMR characteristics have been proposed in order to satisfy the requirement for ever increasing data storage densities in today's magnetic storage systems, such as HDD units. The spin valve MR (SVMR) sensor includes first and second thin-film layers of a ferromagnetic material separated by a thin-film layer of non-magnetic metallic material, and an adjacent layer of anti-ferromagnetic material is formed in physical contact with the second ferromagnetic layer to provide an exchange bias magnetic field by exchange coupling at the interface of the layers. The magnetization direction in the second ferromagnetic layer is constrained or maintained by the exchange coupling, hereinafter the second layer is called a "pinned layer". On the other hand, the magnetization direction of the first ferromagnetic layer is free to rotate in response to an externally applied magnetic field, hereinafter the first layer is called a "free layer". The direction of the magnetization in the free layer changes between parallel and anti-parallel against the direction of the magnetization in the pinned layer, and hence the magneto-resistance greatly changes and giant magneto-resistance characteristics are obtained.

The output characteristic of the SVMR sensor depends upon the angular difference of magnetization between the free and the pinned ferromagnetic layers. The direction of the magnetization of the free layer is free to rotate in accordance with a leakage magnetic field from a magnetic recording medium. That of the pinned layer is fixed to a specific direction (called as "pinned direction") by the exchange coupling between this layer and adjacently formed anti-ferromagnetic layer.

Such an SVMR sensor with a typical structure can attain an MR ratio of up to about 2–6%. The MR ratio MR is given from, $$MR(\%) = 100 \times \Delta Rs(\Omega/\square)/Rs(\Omega/\square),$$

where Rs indicates a sheet resistance and $\Delta Rs$ indicates a change in the resistance.

A synthetic SVMR sensor having a multi-layered pinned structure with a nonmagnetic layer sandwiched by two ferromagnetic layers may attain a higher MR ratio than the typical structure SVMR sensor. However, even in case of such synthetic SVMR sensor, it is impossible to attain an MR ratio of more than 10%.

According to the typical structure SVMR sensor and the synthetic SVMR sensor, an MR ratio attained is very low and also a variation of the sensor characteristics performance will increase because a large ferromagnetic coupling between a pinned layer and a free layer (Hin). It is desired that Hin is substantially zero in order to improve the sensitivity of the sensor and to easily adjust an asymmetrical characteristics of the sensor.

U.S. Pat. No. 6,348,274 B1 discloses an MR element including a pinned layer with two ferromagnetic layers and a nonmetallic multi-layered structure formed by exposure to an atmosphere containing oxygen, nitride or fluorine and sandwiched between the two ferromagnetic layers to improve an MR exchanging rate.

According to this MR element disclosed in U.S. Pat. No. 6,348,274 B1, because it is necessary to form the nonmetallic multi-layered structure of different materials in the pinned layer, the structure itself and also its manufacturing process become complicated. Further, there is no consideration for lowering Hin.

W. F. Egelhoff et al, "Oxygen as a surfactant in the growth of giant magnetoresistance spin valves" J. Appl. Phys. 82(12) pp. 6142–6151 (1997) discloses a bottom type SVMR sensor including an anti-ferromagnetic layer made of NiO, a pinned layer, a free layer and a nonmagnetic metallic layer sandwiched between the pinned layer and the free layer. One surface of the nonmagnetic metallic layer was exposed to oxygen so as to reduce a ferromagnetic coupling (Hin) between the pinned layer and the free layer.

In accordance with this SVMR sensor, although Hin can be reduced, it is impossible to improve the MR ratio.

SUMMARY OF THE INVENTION

It is therefore an object of the present invention to provide a manufacturing method of an MR sensor and a manufacturing method of a thin-film magnetic head with an MR sensor, whereby an MR ratio can be increased and Hin can be reduced without greatly complicating its manufacturing process.

According to the present invention, a manufacturing method of an MR sensor includes a step of stacking an anti-ferromagnetic layer made of an electrically conductive anti-ferromagnetic material, a step of stacking a pinned layer on the anti-ferromagnetic layer, a step of stacking a nonmagnetic spacer layer on the pinned layer, a step of exposing at least once a surface of the nonmagnetic spacer layer to an oxygen-contained atmosphere, a step of stacking a free layer on the nonmagnetic spacer layer, a magnetization direction of the free layer being free depending upon a magnetic filed applied thereto, and a step of providing the pinned layer a magnetization direction fixed by an exchange coupling between the anti-ferromagnetic layer and the pinned layer. According to the present invention also a manufacturing method of an MR sensor includes a step of stacking a free layer, a magnetization direction of the free layer being free depending upon a magnetic filed applied thereto, a step of stacking a nonmagnetic spacer layer on the free layer, a step of exposing at least one time a surface of the nonmagnetic spacer layer to an atmosphere containing an oxygen, a step of stacking a pinned layer on the nonmagnetic spacer layer, a step of stacking an anti-ferromagnetic layer made of an electrically conductive anti-ferromagnetic material on the pinned layer, and a step of providing to the pinned layer a magnetization direction fixed by an exchange coupling between the anti-ferromagnetic layer and the pinned layer.

Furthermore, according to the present invention, a manufacturing method of an MR sensor includes a step of stacking an anti-ferromagnetic layer made of an electrically conductive anti-ferromagnetic material, a step of stacking a pinned layer on the anti-ferromagnetic layer, a step of stacking in partway a nonmagnetic spacer layer on the pinned layer, a step of exposing at least one time a partway surface of the nonmagnetic spacer layer to an oxygen-contained atmosphere, a step of stacking a remainder of the nonmagnetic spacer layer on the exposed partway surface of the nonmagnetic spacer layer, a step of stacking a free layer on the nonmagnetic spacer layer, a magnetization direction of the free layer being free depending upon a magnetic filed applied thereto, and a step of providing the pinned layer a magnetization direction fixed by an exchange coupling between the anti-ferromagnetic layer and the pinned layer. Also, according to the present invention, a manufacturing method of an MR sensor includes a step of stacking a free layer, a magnetization direction of the free layer being free depending upon a magnetic filed applied thereto, a step of stacking in partway a nonmagnetic spacer layer on the free layer, a step of exposing at least one time a partway surface of the nonmagnetic spacer layer to an oxygen-contained atmosphere, a step of stacking a remainder of the nonmagnetic spacer layer on the exposed partway surface of the nonmagnetic spacer layer, a step of stacking a pinned layer on the nonmagnetic spacer layer, a step of stacking an anti-ferromagnetic layer made of an electrically conductive anti-ferromagnetic material on the pinned layer, and a step of providing to the pinned layer a magnetization direction fixed by an exchange coupling between the anti-ferromagnetic layer and the pinned layer.

The present invention also provide a manufacturing method of a thin-film magnetic head with an MR sensor fabricated by one of the aforementioned manufacturing methods.

Because the surface or the halfway surface of the nonmagnetic spacer layer is exposed to an oxygen-contained atmosphere, a roughness in atomic level at an interface between the nonmagnetic spacer layer and the free layer or the pinned layer is decreased resulting an increased MR ratio and a reduced Hin. It should be noted that this improvement in the MR ratio can be obtained when the anti-ferromagnetic layer is made of an electrically conductive anti-ferromagnetic material. Namely, if the anti-ferromagnetic layer is made of an insulating anti-ferromagnetic material, an wettability between the anti-ferromagnetic layer and the ferromagnetic layer of the pinned layer becomes poor, and therefore crystallization and diameters in crystals of the MR multi-layered film would be seriously affected. Thus, in this case, even if the nonmagnetic spacer layer is exposed to oxygen, sufficient effect there from cannot be expected. Contrary to this, when the anti-ferromagnetic layer is made of an electrically conductive anti-ferromagnetic material, a relatively good wettability will be obtained between this anti-ferromagnetic layer and a ferromagnetic layer of the pinned layer. As a result, diameters in crystals of the MR multi-layered film will become relatively large and therefore the MR ratio will increase by the exposure. Therefore, a large output MR sensor can be fabricated without greatly complicating its manufacturing process.

It is preferred that a thickness of the nonmagnetic spacer layer stacked in partway is greater than 0.5 nm.

It is also preferred that the exposing step includes exposing the surface of the nonmagnetic spacer layer to an oxygen-contained atmosphere so that an exposure amount becomes within a range from $1.33 \times 10^{-3}$ to $1.33 \times 10^{2}$ Pa·sec.

It is further preferred that the exposing step includes exposing the surface of the nonmagnetic spacer layer to an atmosphere of only oxygen gas, an atmosphere of a mixed gas containing oxygen gas and a noble gas, or an atmosphere of a mixed gas containing oxygen gas and a nitrogen gas It is preferred that the stacking step of a pinned layer includes stacking a first ferromagnetic layer, stacking a nonmagnetic layer on the first ferromagnetic layer, and stacking a second ferromagnetic layer on the nonmagnetic layer.

Further objects and advantages of the present invention will be apparent from the following description of the preferred embodiments of the invention as illustrated in the accompanying drawings.

DESCRIPTION OF THE PREFERRED EMBODIMENTS

First Embodiment

Figure 1:
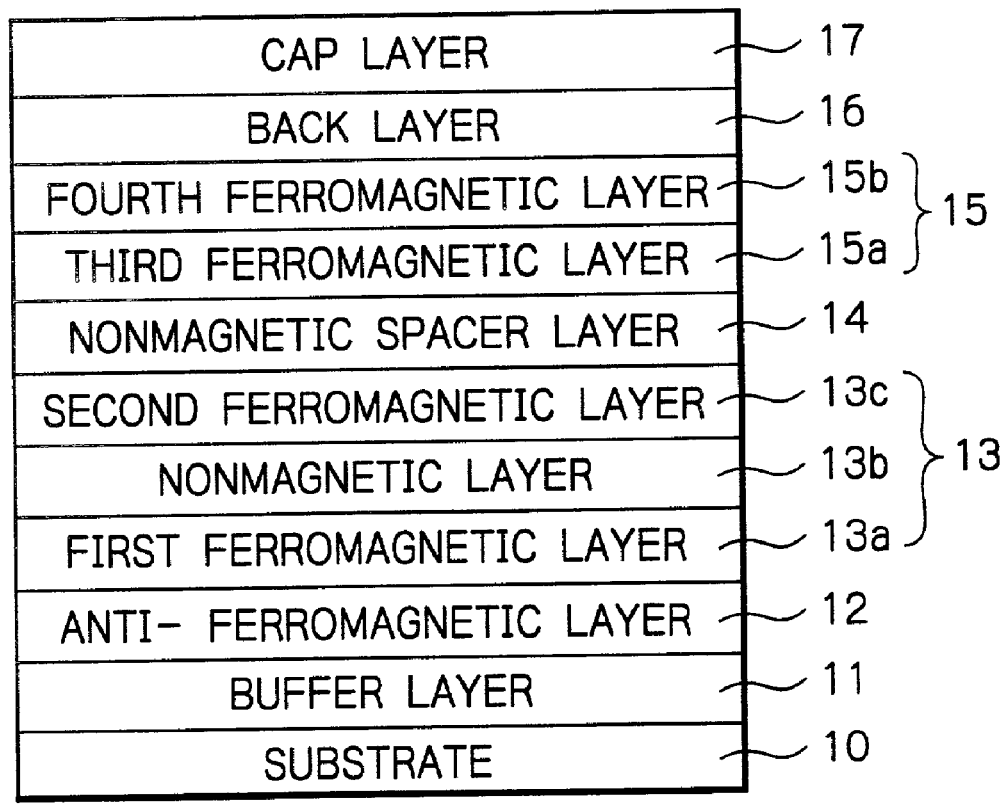
FIG. 1 shows a cross-sectional view seen from an air bearing surface (ABS), schematically illustrating a layer structure of a SVMR multi-layered film in a first embodiment according to the present invention.

FIG. 1 is a cross-sectional view, seen from the ABS, schematically illustrating a layer structure of a SVMR multi-layered film in a first embodiment according to the present invention. This first embodiment concerns a bottom type SVMR sensor with an anti-ferromagnetic layer positioned at the bottom or the substrate side of the sensor.

Referring to FIG. 1, reference numeral 10 denotes a substrate, 11 denotes a buffer layer made of, for example, NiCr and deposited on an insulation layer (not shown) that is formed on the substrate 10, 12 denotes a conductive anti-ferromagnetic layer made of, for example, PtMn and deposited on the buffer layer 11, 13 denotes a magnetization fixed layer or a pinned layer deposited on the anti-ferromagnetic layer 12, 14 denotes a nonmagnetic spacer layer made of, for example, Cu and deposited on the pinned layer 13, 15 denotes a magnetization free layer or a free layer deposited on the nonmagnetic spacer layer 14, 16 denotes a back layer made of for example Ru, Cu and deposited on the free layer 15, and 17 denotes a cap layer made of for example Ta and deposited on the back layer 16, respectively.

In this first embodiment, the pinned layer 13 has a synthetic multi-layered structure composed of a first ferromagnetic layer 13a of CoFe, for example, a nonmagnetic layer 13b of Ru, for example, and a second ferromagnetic layer 13c of CoFe, for example. The free layer 15 has a two-layered structure composed of a third ferromagnetic layer 15a of CoFe, for example, and a fourth ferromagnetic layer 15b of NiFe, for example.

Figure 2:
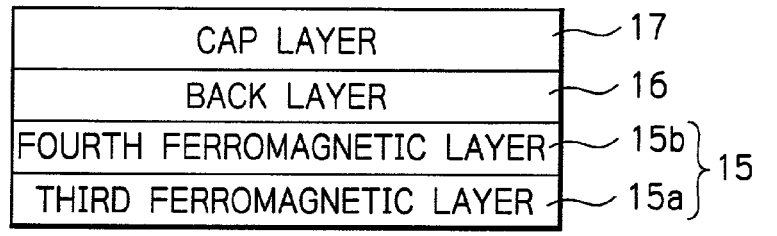
FIG. 2 shows a cross-sectional view seen from the ABS, illustrating a manufacturing process of the SVMR multi-layered film in the first embodiment of FIG. 1.

FIG. 2 is a cross-sectional view, seen from the ABS, illustrating a manufacturing process of the SVMR multi-layered film in the first embodiment of FIG. 1.

As shown in the figure, on the substrate 10, the buffer layer 11, the anti-ferromagnetic layer 12, the pinned layer 13 and the nonmagnetic spacer layer 14 are stacked, and thereafter an upper surface of this nonmagnetic spacer layer 14 is exposed to an oxygen-contained atmosphere.

This oxygen-exposure may be executed for only one time or two or more times. The oxygen-exposure amount may be in a range from $1.33 \times 10^{-3}$ to $1.33 \times 10^{2}$ Pa·sec, but preferably in a range from $1.33 \times 10^{-2}$ to $6.65 \times 10$ Pa·sec. The atmosphere to be exposed may contain only oxygen gas, or it may contain a mixture gas of oxygen gas and a noble gas such as Ne, Ar, Kr or Xe, for example, or of oxygen gas and a nitrogen gas.

After the oxygen-exposure of the surface of the nonmagnetic spacer layer 14, the free layer 15, the back layer 16 and the cap layer 17 are sequentially stacked thereon.

According to this first embodiment, because the surface of the nonmagnetic spacer layer 14 is exposed to an oxygen-contained atmosphere, a roughness in atomic level at an interface between the nonmagnetic spacer layer 14 and the third ferromagnetic layer 15a of the free layer 15 is decreased resulting in an increased MR ratio and a reduced Hin. Particularly, because the anti-ferromagnetic layer 12 is made of an electrically conductive anti-ferromagnetic material, a relatively good wettability will be obtained between this anti-ferromagnetic layer 12 and the first ferromagnetic layer 13a of the pinned layer 13. As a result, diameters in crystals of the MR multi-layered film will become relatively large and therefore the MR ratio will increase.

Also, in the first embodiment, because there are many applicable exposure conditions of oxygen, a large margin in the manufacturing process can be expected resulting in any easier manufacturing process.

Second Embodiment

Figure 3:
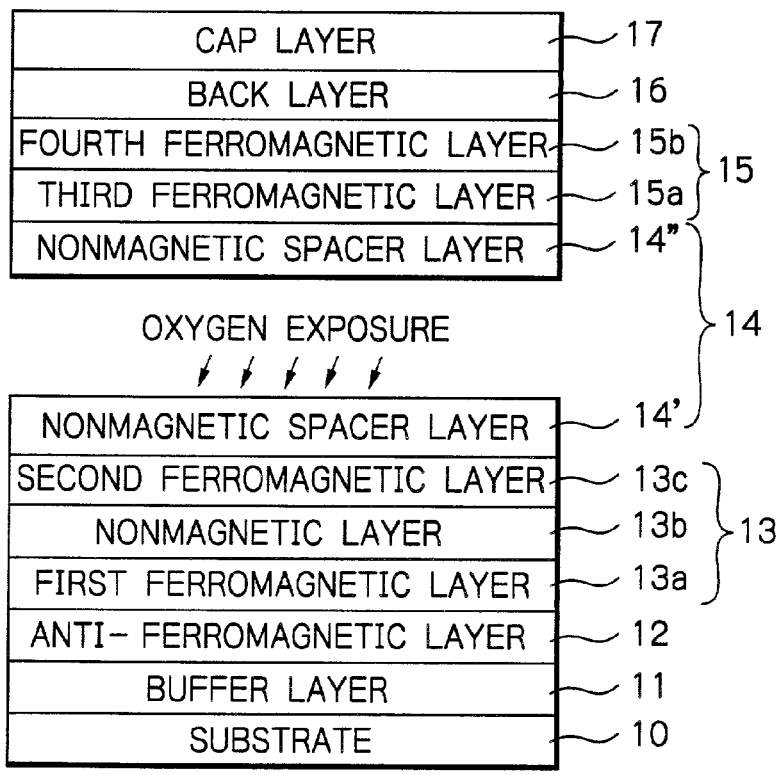
FIG. 3 shows a cross-sectional view seen from an ABS, schematically illustrating a layer structure of a SVMR multi-layered film in a second embodiment according to the present invention.

FIG. 3 is a cross-sectional view, illustrating a manufacturing process of the SVMR multi-layered film in a second embodiment. This second embodiment also concerns a bottom type SVMR sensor with an anti-ferromagnetic layer positioned at the bottom or the substrate side of the sensor.

As shown in the figure, on the substrate 10, the buffer layer 11, the anti-ferromagnetic layer 12 and the pinned layer 13 are stacked, and then the nonmagnetic spacer layer 14 is partially stacked. Thereafter an upper surface of this partially stacked nonmagnetic spacer layer 14' is exposed to an oxygen-contained atmosphere.

This oxygen-exposure may be executed for only one time or two or more times. The oxygen-exposure amount may be in a range from $1.33 \times 10^{-3}$ to $1.33 \times 10^{2}$ Pa·sec, but preferably in a range from $1.33 \times 10^{-2}$ to $6.65 \times 10$ Pa·sec. The atmosphere to be exposed may contain only oxygen gas, or it may contain a mixture of oxygen gas and a noble gas such as Ne, Ar, Kr or Xe, for example, or of oxygen gas and a nitrogen gas.

After the oxygen-exposure of the surface of the partially stacked nonmagnetic spacer layer 14', a remaining layer 14" of the nonmagnetic spacer layer 14, the free layer 15, the back layer 16 and the cap layer 17 are sequentially stacked thereon.

According to this second embodiment, because a halfway surface of the nonmagnetic spacer layer 14 is exposed to an oxygen-contained atmosphere, a roughness in atomic level at an interface between the nonmagnetic spacer layer 14 and the third ferromagnetic layer 15a of the free layer 15 is decreased resulting in an increased MR ratio and a reduced Hin. Particularly, because the anti-ferromagnetic layer 12 is made of an electrically conductive anti-ferromagnetic material, a relatively good wettability will be obtained between this anti-ferromagnetic layer 12 and the first ferromagnetic layer 13a of the pinned layer 13. As a result, diameters in crystals of the MR multi-layered film will become relatively large and, therefore, the MR ratio will increase.

In this second embodiment of the bottom type SVMR sensor in which the mid-surface of the nonmagnetic spacer layer 14 is exposed to an oxygen-contained atmosphere, a sign of Hin will change between positive and negative depending upon the entire thickness of the nonmagnetic spacer layer 14 or upon the position of the exposed halfway surface. It is considered that the change in sign of Hin with respect to the entire thickness of the nonmagnetic spacer layer 14 represents a reduction in roughness or restriction of mutual diffusion in an interface between the nonmagnetic spacer layer 14 and the free layer 15. Namely, by adjusting the entire thickness of the nonmagnetic spacer layer 14 or the position of its exposed halfway surface, it is possible to control Hin to a value near zero with keeping the MR ratio at a large value. Also, in the second embodiment, because there are many applicable exposure conditions of oxygen, a large margin in the manufacturing process can be expected resulting in an easier manufacturing process.

Third Embodiment

Figure 4:
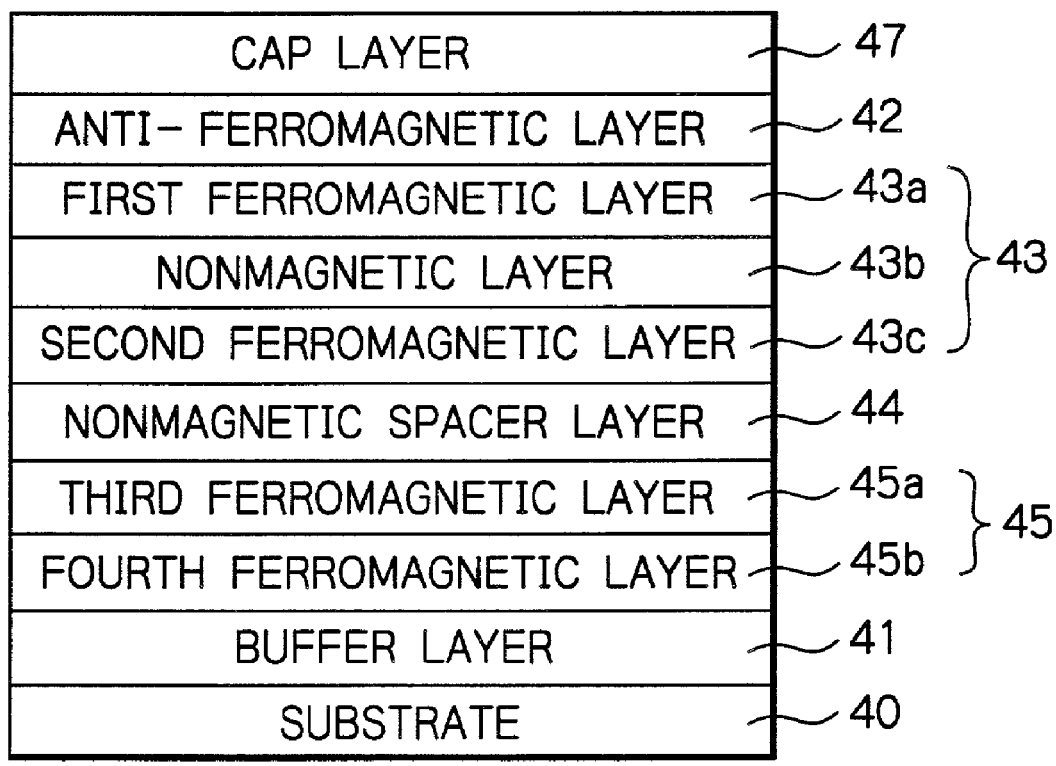
FIG. 4 shows a cross-sectional view seen from an ABS, schematically illustrating a layer structure of a SVMR multi-layered film in a third embodiment according to the present invention.

FIG. 4 is a cross-sectional view, seen from the ABS, schematically illustrating a layer structure of a SVMR multi-layered film in a third embodiment according to the present invention. This third embodiment concerns a top type SVMR sensor with an anti-ferromagnetic layer positioned at the top or the opposite side with respect to a substrate of the sensor.

Referring to FIG. 4, reference numeral 40 denotes the substrate, 41 denotes a buffer layer made of, for example, NiCr and deposited on an insulation layer (not shown) that is formed on the substrate 40, 45 denotes a magnetization free layer or a free layer deposited on the buffer layer 41, 44 denotes a nonmagnetic spacer layer made of, for example, Cu and deposited on the free layer 45, 43 denotes a magnetization fixed layer or a pinned layer deposited on the nonmagnetic spacer layer 44, 42 denotes a conductive anti-ferromagnetic layer made of, for example, PtMn and deposited on the pinned layer 43, and 47 denotes a cap layer made of, for example, Ta and deposited on the anti-ferromagnetic layer 42, respectively.

In this third embodiment, the pinned layer 43 has a synthetic structure of multi-layered structure composed of a first ferromagnetic layer 43a of CoFe, for example, a nonmagnetic layer 43b of Ru, for example, and a second ferromagnetic layer 43c of CoFe, for example. The free layer 45 has a two-layered structure composed of a third ferromagnetic layer 45a of CoFe, for example, and a fourth ferromagnetic layer 45b of NiFe, for example.

Figure 5:
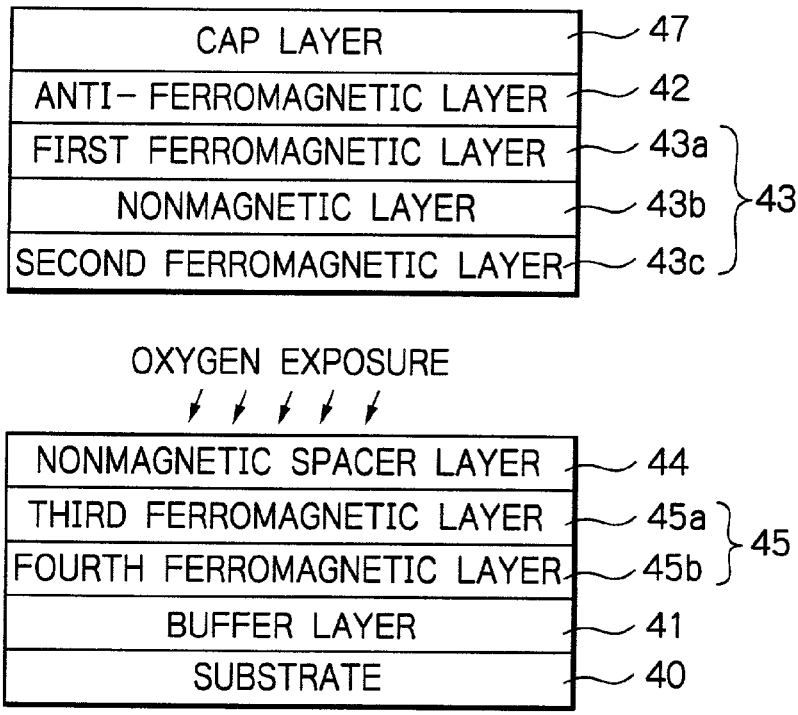
FIG. 5 shows a cross-sectional view seen from the ABS, illustrating a manufacturing process of the SVMR multi-layered film in the third embodiment of FIG. 4.

FIG. 5 is a cross-sectional view, seen from the ABS, illustrating a manufacturing process of the SVMR multi-layered film in the third embodiment of FIG. 4.

As shown in the figure, on the substrate 40, the buffer layer 41, the free layer 45 and the nonmagnetic spacer layer 44 are stacked, and thereafter an upper surface of this nonmagnetic spacer layer 44 is exposed to an atmosphere containing oxygen.

This oxygen-exposure may be executed for only one time or two or more times. The oxygen-exposure amount may be in a range from $1.33 \times 10^{-3}$ to $1.33 \times 10^2$ Pa·sec, but preferably in a range from $1.33 \times 10^{-2}$ to $6.65 \times 10$ Pa·sec. The atmosphere to be exposed may contain only oxygen gas, or contain a mixture of oxygen gas and a noble gas such as Ne, Ar, Kr or Xe, for example, or of oxygen gas and a nitrogen gas.

After the oxygen-exposure of the surface of the nonmagnetic spacer layer 44, the pinned layer 43, the anti-ferromagnetic layer 42 and the cap layer 47 are sequentially stacked thereon.

According to this third embodiment, because the surface of the nonmagnetic spacer layer 44 is exposed to an oxygen-contained atmosphere, a roughness in atomic level at an interface between the nonmagnetic spacer layer 44 and the second ferromagnetic layer 43c of the pinned layer 43 is decreased resulting in an increased MR ratio and a reduced Hin.

In this third embodiment of the top type SVMR sensor in which the upper surface of the nonmagnetic spacer layer 44 is exposed to an oxygen-contained atmosphere, a sign of Hin will change between positive and negative depending upon the entire thickness of the nonmagnetic spacer layer 44. It is considered that the change in sign of Hin with respect to the entire thickness of the nonmagnetic spacer layer 44 represents a reduction in roughness or restriction of mutual diffusion in an interface between the nonmagnetic spacer layer 44 and the pinned layer 43. Namely, by adjusting the entire thickness of the nonmagnetic spacer layer 44, it is possible to control Hin to a value near zero with keeping the MR ratio at a large value. Also, in the third embodiment, because there are many applicable exposure conditions of oxygen, a large margin in the manufacturing process can be expected resulting in any easier manufacturing process.

Fourth Embodiment

Figure 6:
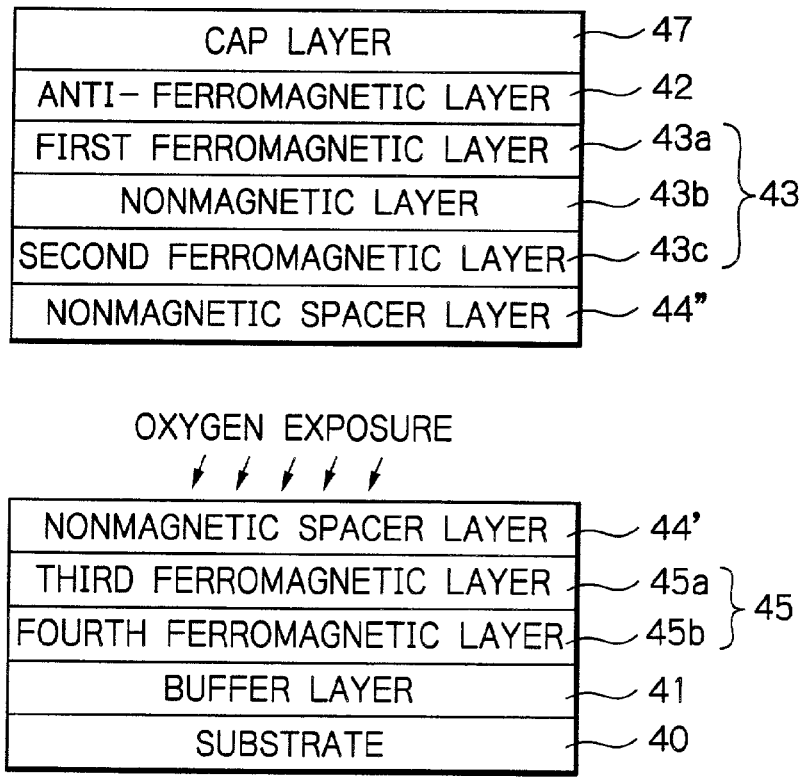
FIG. 6 shows a cross-sectional view seen from an ABS, schematically illustrating a layer structure of a SVMR multi-layered film in a fourth embodiment according to the present invention.

FIG. 6 is a cross-sectional view, illustrating a manufacturing process of the SVMR multi-layered film in a fourth embodiment. This fourth embodiment concerns a top type SVMR sensor with an anti-ferromagnetic layer positioned at the top or the opposite side with respect to a substrate of the sensor.

As shown in the figure, on the substrate 40, the buffer layer 41 and the free layer 43 are stacked, and then the nonmagnetic spacer layer 44 is partially stacked. Thereafter an upper surface of this partially stacked nonmagnetic spacer layer 44' is exposed to an atmosphere containing oxygen.

This oxygen-exposure may be executed for only one time or two or more times. The oxygen-exposure amount may be in a range from $1.33 \times 10^{-3}$ to $1.33 \times 10^2$ Pa·sec, but preferably in a range from $1.33 \times 10^{-2}$ to $6.65 \times 10$ Pa·sec. The atmosphere to be exposed may contain only oxygen gas, or contain a mixture of oxygen gas and a noble gas such as Ne, Ar, Kr or Xe, for example, or of an oxygen gas and a nitrogen gas.

After the oxygen-exposure of the surface of the partially stacked nonmagnetic spacer layer 44', a remaining layer 44" of the nonmagnetic spacer layer 44, the pinned layer 43, the anti-ferromagnetic layer 42 and the cap layer 47 are sequentially stacked thereon.

According to this fourth embodiment, because the halfway surface of the nonmagnetic spacer layer 44 is exposed to an oxygen-contained atmosphere, a roughness in atomic level at an interface between the nonmagnetic spacer layer 44 and the second ferromagnetic layer 43c of the pinned layer 43 is decreased, resulting an increased MR ratio and a reduced Hin.

In this fourth embodiment of the top type SVMR sensor in which the halfway surface of the nonmagnetic spacer layer 44 is exposed to an oxygen-contained atmosphere, a sign of Hin will change between positive and negative depending upon the entire thickness of the nonmagnetic spacer layer 44 or upon the position of the exposed halfway surface. It is considered that the change in sign of Hin with respect to the entire thickness of the nonmagnetic spacer layer 44 represents a reduction in roughness or restriction of mutual diffusion in an interface between the nonmagnetic spacer layer 44 and the pinned layer 43. Namely, by adjusting the entire thickness of the nonmagnetic spacer layer 44 or the position of its exposed halfway surface, it is possible to control Hin to a value near zero with keeping the MR ratio at a large value. Also, in the fourth embodiment, because there are many applicable exposure conditions of oxygen, a large margin in the manufacturing process can be expected resulting in an easier manufacturing process.

FIRST EXAMPLE

In a first example, various samples of the bottom type SVMR multi-layered film with a nonmagnetic spacer layer or a Cu layer were fabricated. These Cu layers of the samples had different entire thicknesses with each other and their surfaces were exposed to an oxygen-contained atmosphere. For a comparison, samples of a conventional bottom type SVMR multi-layered film with a Cu layer not exposed to an oxygen-contained atmosphere were fabricated. The layer structure of these samples was Si/Al$_2$O$_3$/NiCr (4 nm)/PtMn (13 nm)/CoFe (1.5 nm)/Ru (0.8 nm)/CoFe (2 nm)/Cu//CoFe (1 nm)/NiFe (2 nm)/Ru (0.5 nm)/Ta (2 nm). The mark of "//" indicates a position of the oxygen exposure. An annealing process was performed in three steps of an annealing for keeping 270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer. Oxygen-exposure conditions were $5.32 \times 10^{-3}$ Pa·sec for 10 seconds.

A sheet resistance Rs, a change in resistance ΔRs, a ferromagnetic coupling Hin and a coercive force Hc were measured with respect to these samples, and an MR ratio MR was calculated from MR (%)=100×ΔRs (Ω/□)/Rs (Ω/□). The results are indicated in Table 1, and FIGS. 7 and 8.

TABLE 1

| Sample No. | O$_2$ Exposure of Cu layer | Thickness to O$_2$ exposure surface (nm) | Whole thickness of Cu layer (nm) | MR (%) | ΔRs (Ω/□) | Rs (Ω/□) | Hin (A/m) | Hc (A/m) |
|---|---|---|---|---|---|---|---|---|
| 1 | No | — | 1.9 | 13.7 | 2.47 | 18.0 | 1548.4 | 55.3 |
| 2 | No | — | 2.1 | 13.4 | 2.24 | 17.1 | 1019.1 | 55.3 |
| 3 | Surface | 1.7// | 1.7 | 15.2 | 2.84 | 18.7 | 4463.5 | 63.2 |
| 4 | Surface | 1.8// | 1.8 | 15.2 | 2.76 | 18.1 | 2551.7 | 55.3 |
| 5 | Surface | 1.9// | 1.9 | 15.1 | 2.63 | 17.4 | 1042.8 | 79.0 |
| 6 | Surface | 2.0// | 2.0 | 14.9 | 2.52 | 16.9 | 592.5 | 86.9 |
| 7 | Surface | 2.1// | 2.1 | 14.7 | 2.41 | 16.4 | 592.5 | 94.8 |

Figure 7:
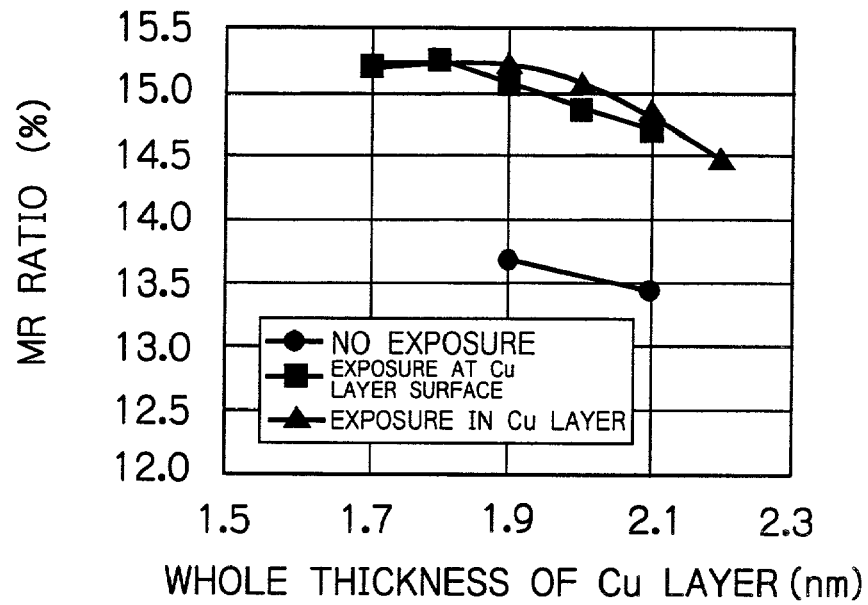
FIG. 7 shows a graph illustrating a characteristics of an MR ratio with respect to an entire thickness of a Cu layer in first and second examples.
Figure 8:
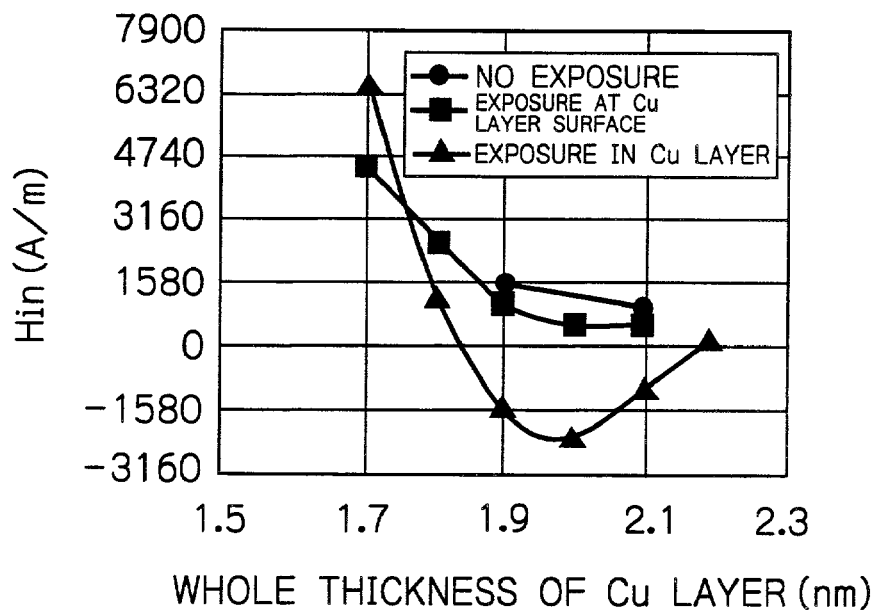
FIG. 8 shows a graph illustrating a characteristics of a Hin with respect to an entire thickness of a Cu layer in the first and second examples.

As will be noted from Table 1, and FIGS. 7 and 8, the MR ratio of the oxygen-exposed samples 3–7 is greater than that of unexposed samples 1 and 2 of the conventional bottom type SVMR multi-layered film. Also, as will be apparent from a comparison of the sample 1 with the sample 5 and a comparison of the sample 2 with the sample 7, if the entire thickness of the Cu layer is the same with each other, Hin is reduced in case of oxygen exposure. It is possible to decrease Hin by appropriately selecting the entire thickness of the Cu layer.

SECOND EXAMPLE

As for a second example, various samples of the bottom type SVMR multi-layered film with a nonmagnetic spacer layer or a Cu layer were fabricated. These Cu layers of the samples had different entire thicknesses with each other. Each Cu layer was deposited halfway to a thickness of 0.8 nm, the halfway surface was exposed to an oxygen-contained atmosphere, and then the remaining Cu layer was deposited. For a comparison, samples of a conventional bottom type SVMR multi-layered film with a Cu layer not exposed to an oxygen-contained atmosphere were fabricated. Layer structure of these samples, annealing process and measurement were the same as these in the first example. The results are indicated in Table 2, and FIGS. 7 and 8.

As will be noted from Table 2, and FIGS. 7 and 8, the MR ratio of the oxygen-exposed samples 8–13 is greater than that of unexposed samples 1 and 2 of the conventional bottom type SVMR multi-layered film. It is possible to decrease Hin by appropriately selecting the entire thickness of the Cu layer.

THIRD EXAMPLE

As for a third example, various samples of the bottom type SVMR multi-layered film with a nonmagnetic spacer layer or a Cu layer were fabricated. These Cu layers of the samples had the same entire thickness. Each Cu layer was deposited halfway to various thicknesses, the halfway surface was exposed to an oxygen-contained atmosphere, and then the remaining Cu layer was deposited. For a comparison, samples of a conventional bottom type SVMR multi-layered film with a Cu layer not exposed to an oxygen-contained atmosphere were fabricated. Also, a sample of which Cu layer was exposed to an oxygen-contained atmosphere twice was fabricated. A layer structure of these samples was Si/Al$_2$O$_3$/NiCr (4 nm)/PtMn (13 nm)/CoFe(1.5 nm)/Ru (0.8 nm)/CoFe(2 nm)/Cu (x nm)//Cu(1.9–x nm)/CoFe(1 nm)/NiFe(2 nm)/Ru(0.5 nm)/Ta(2 nm). The mark of "//" indicates a position of the oxygen exposure. An annealing process was performed in three steps for keeping 270° C. for 10 minutes under application of a magnetic field of 79 kA/m in a direction along the magnetization direction of the free layer, an annealing for keeping 270° C. for 3 hours under application of a magnetic field of 632 kA/m in a

TABLE 2

| Sample No. | O$_2$ Exposure of Cu layer | Thickness to O$_2$ exposure surface (nm) | Whole thickness of Cu layer (nm) | MR (%) | ΔRs (Ω/□) | Rs (Ω/□) | Hin (A/m) | Hc (A/m) |
|---|---|---|---|---|---|---|---|---|
| 1 | No | — | 1.9 | 13.7 | 2.47 | 18.0 | 1548.4 | 55.3 |
| 2 | No | — | 2.1 | 13.4 | 2.24 | 17.1 | 1019.1 | 55.3 |
| 8 | Halfway | 0.8//0.9 | 1.7 | 15.2 | 2.90 | 19.1 | 6549.1 | 63.2 |
| 9 | Halfway | 0.8//1.0 | 1.8 | 15.2 | 2.82 | 18.5 | 1264.0 | 63.2 |
| 10 | Halfway | 0.8//1.1 | 1.9 | 15.2 | 2.74 | 18.0 | −1643.2 | 71.1 |
| 11 | Halfway | 0.8//1.2 | 2.0 | 15.1 | 2.63 | 17.4 | −2283.1 | 102.7 |
| 12 | Halfway | 0.8//1.3 | 2.1 | 14.8 | 2.49 | 16.8 | −1185.0 | 94.8 |
| 13 | Halfway | 0.8//1.4 | 2.2 | 14.5 | 2.37 | 16.4 | 205.4 | 79.0 | direction along the magnetization direction of the pinned layer, and an annealing for keeping 210° C. for 2 hours under application of a magnetic field of 15.8 kA/m in a direction along the magnetization direction of the free layer. Oxygen-exposure conditions were $5.32 \times 10^{-3}$ Pa·sec for 10 seconds.

A sheet resistance Rs, a change in resistance ΔRs, a ferromagnetic coupling Hin and a coercive force Hc were measured with respect to these samples, and an MR ratio MR was calculated from MR (%)=100×ΔRs(Ω/□)/Rs(Ω/□). The results are indicated in Table 3, and FIGS. 9 and 10.

TABLE 3

| Sample No. | O₂ Exposure of Cu layer | Thickness to O₂ exposure surface (nm) | Whole thickness of Cu layer (nm) | MR (%) | ΔRs (Ω/□) | Rs (Ω/□) | Hin (A/m) | Hc (A/m) |
|---|---|---|---|---|---|---|---|---|
| 1  | No              | —   | 1.9 | 13.7 | 2.47 | 18.0 | 1548.4  | 55.3  |
| 14 | Halfway         | 0.0 | 1.9 | 0.3  | 0.08 | 24.1 | 9598.5  | 15.8  |
| 15 | Halfway         | 0.3 | 1.9 | 6.9  | 1.43 | 20.8 | 12450.4 | 655.7 |
| 16 | Halfway         | 0.5 | 1.9 | 13.7 | 2.48 | 18.1 | 2978.3  | 244.9 |
| 17 | Halfway         | 0.6 | 1.9 | 14.8 | 2.67 | 18.0 | −1564.2 | 86.9  |
| 18 | Halfway         | 0.8 | 1.9 | 15.3 | 2.75 | 18.0 | −1769.6 | 110.6 |
| 19 | Halfway         | 1.0 | 1.9 | 15.2 | 2.74 | 18.1 | −316.0  | 79.0  |
| 20 | Halfway         | 1.2 | 1.9 | 15.2 | 2.74 | 18.0 | 663.6   | 71.1  |
| 21 | Halfway         | 1.4 | 1.9 | 15.1 | 2.70 | 17.9 | 481.9   | 63.2  |
| 22 | Halfway         | 1.6 | 1.9 | 15.1 | 2.69 | 17.9 | 679.4   | 71.1  |
| 23 | Halfway         | 1.9 | 1.9 | 15.1 | 2.67 | 17.7 | 1185.0  | 71.1  |
| 24 | Halfway two times | 0.8 | 1.9 | 15.3 | 2.71 | 17.8 | −2330.5 | 150.1 |

Figure 9:
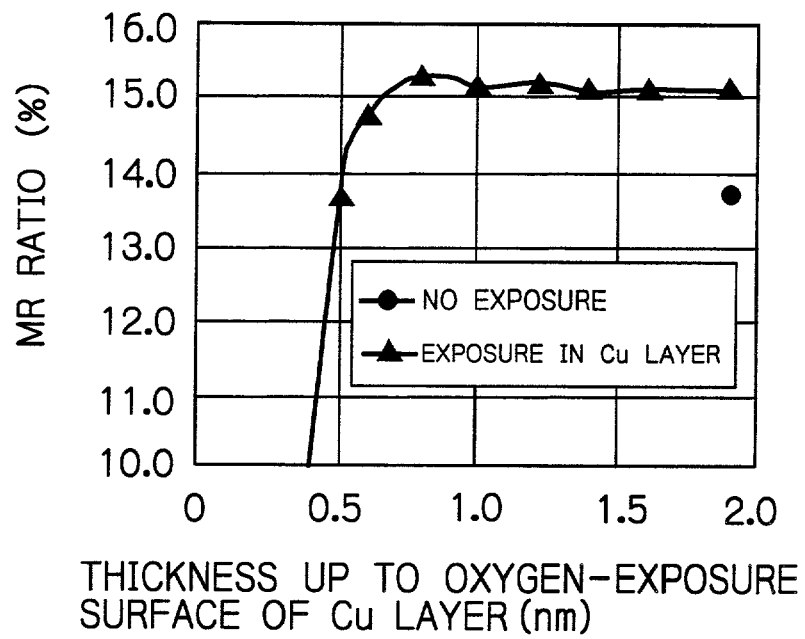
FIG. 9 shows a graph illustrating a characteristics of an MR ratio with respect to a thickness to an oxygen-exposure surface of a Cu layer in a third example.
Figure 10:
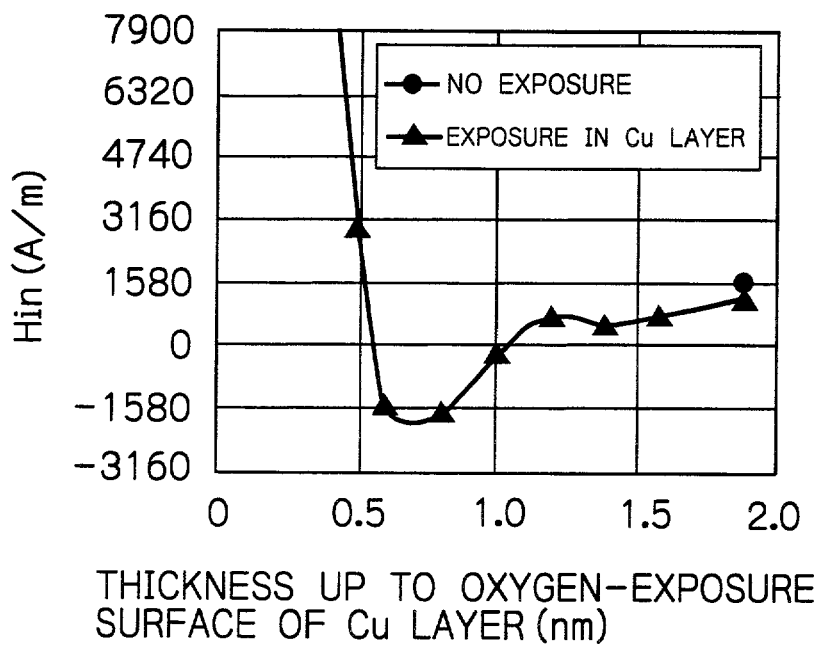
FIG. 10 shows a graph illustrating a characteristics of a Hin with respect to a thickness to an oxygen-exposure surface of a Cu layer in the third example.

As will be noted from Table 3, and FIGS. 9 and 10, the MR ratio and Hin change depending upon the thickness to the halfway surface exposed to an oxygen-contained atmosphere in the Cu layer. The MR ratio of the samples 17–24 that have thicknesses to the halfway surface exposed to an oxygen-contained atmosphere of 0.5 nm or more is greater than that of unexposed sample 1 of the conventional bottom type SVMR multi-layered film. Also, Hin of the samples 19–22 that have thicknesses to the halfway surface exposed to an oxygen-contained atmosphere of 1.0–1.6 nm is reduced. It is possible to increase the MR ratio and to decrease Hin by appropriately selecting the thickness to the halfway surface exposed to an oxygen-contained atmosphere in the Cu layer. In general, it is desired that Hin is in a range of −790–790 A/m. The sample 24 with a Cu layer exposed to an oxygen-contained atmosphere twice has similar advantages.

FOURTH EXAMPLE

As a fourth example, various samples of the bottom type SVMR multi-layered film with a nonmagnetic spacer layer or a Cu layer were fabricated. These Cu layers of the samples had the same entire thickness and oxygen-exposure conditions at the surfaces of the Cu layers were different with each other. For a comparison, samples of a conventional bottom type SVMR multi-layered film with a Cu layer not exposed to an oxygen-contained atmosphere were fabricated. The layer structure of these samples was Si/Al₂O₃/NiCr(4 nm)/PtMn (13 nm)/CoFe(1.5 nm)/Ru(0.8 nm)/CoFe(2 nm)/Cu(1.9 nm)//CoFe(1 mm)/NiFe(2 nm)/Ru(0.5 nm)/Ta(2 nm). The mark of "//" indicates a position of the oxygen exposure. An annealing process was performed in three steps of an annealing for keeping 270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer.

A sheet resistance Rs, a change in resistance ΔRs, a ferromagnetic coupling Hin and a coercive force Hc were measured with respect to these samples, and an MR ratio MR was calculated from MR (%)=100×ΔRs(Ω/□)/Rs(Ω/□). The results are indicated in Table 4 and FIG. 11.

TABLE 4

| | O₂ exposure conditions | | | | | | | |
|---|---|---|---|---|---|---|---|---|
| Sample No. | Pressure (mPa) | Time (seconds) | Exposure amount (Pa · sec) | MR (%) | ΔRs (Ω/□) | Rs (Ω/□) | Hin (A/m) | Hc (A/m) |
| 25 | —     | —  | 0          | 13.8 | 2.51 | 18.2 | 1587.9 | 55.3 |
| 26 | 0.665 | 2  | 1.33E − 03 | 15.0 | 2.65 | 17.6 | 1066.5 | 79.0 |
| 27 | 2.66  | 5  | 1.33E − 02 | 15.0 | 2.66 | 17.7 | 1098.1 | 79.0 |
| 28 | 2.66  | 10 | 2.66E − 02 | 15.0 | 2.63 | 17.5 | 1129.7 | 71.1 |
| 29 | 2.66  | 30 | 7.98E − 02 | 15.1 | 2.65 | 17.6 | 1042.8 | 79.0 |
| 30 | 2.66  | 60 | 15.96E − 02| 15.0 | 2.63 | 17.5 | 963.8  | 86.9 |
| 31 | 5.32  | 10 | 5.32E − 02 | 15.1 | 2.63 | 17.4 | 979.6  | 71.1 |
| 32 | 1.064 | 10 | 10.64E − 02| 15.1 | 2.61 | 17.3 | 948.0  | 79.0 |

TABLE 4-continued

| | O₂ exposure conditions | | | | | | |
|---|---|---|---|---|---|---|---|
| Sample No. | Pressure (mPa) | Time (seconds) | Exposure amount (Pa · sec) | MR (%) | ΔRs (Ω/□) | Rs (Ω/□) | Hin (A/m) | Hc (A/m) |
| 33 | 79.8 | 10 | 7.98E − 01 | 15.0 | 2.62 | 17.4 | 861.1 | 79.0 |
| 34 | 159.6 | 10 | 15.96E − 01 | 15.1 | 2.63 | 17.4 | 845.3 | 86.9 |
| 35 | 78.3 | 10 | 67.83E − 01 | 15.0 | 2.61 | 17.4 | 813.7 | 95.8 |
| 36 | 6650 | 10 | 6.65E + 01 | 15.1 | 2.63 | 17.4 | 1169.2 | 126.4 |
| 37 | 13300 | 10 | 1.33E + 02 | 15.0 | 2.62 | 17.5 | 987.5 | 86.9 |

Figure 11:
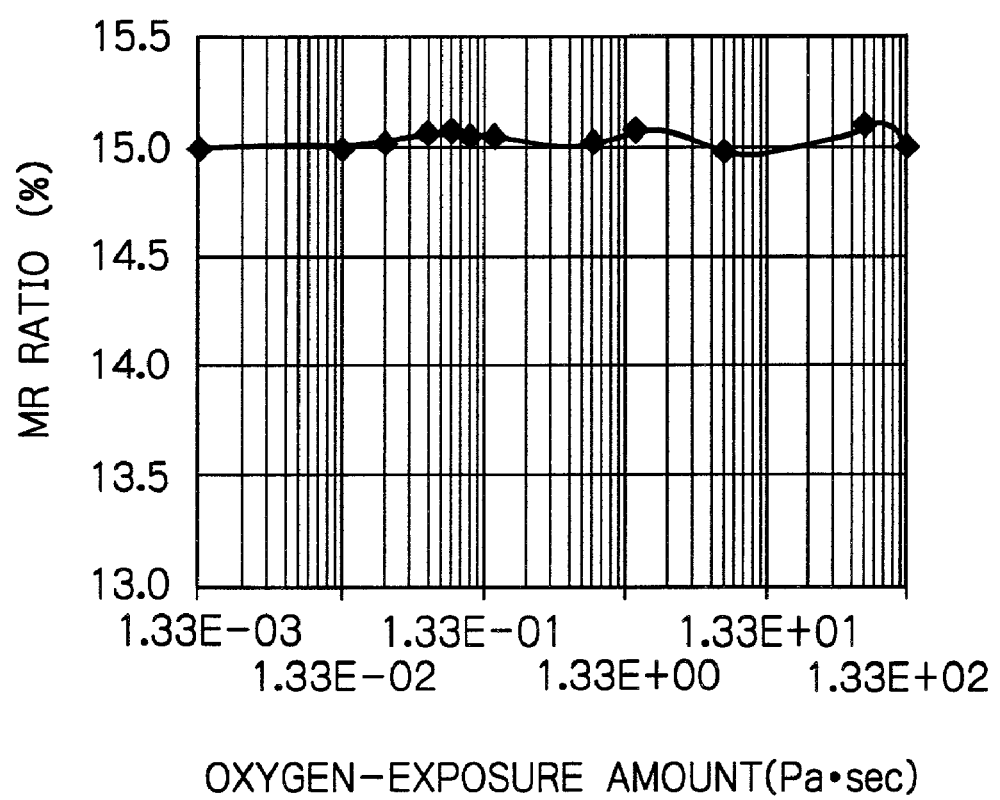
FIG. 11 shows a graph illustrating a characteristics of an MR ratio with respect to an oxygen-exposure amount in a fourth example.

As will be noted from Table 4 and FIG. 11, the MR ratio of the samples 26–37 that were exposed to an oxygen-contained atmosphere under the conditions of $1.33 \times 10^{-3}$ to $1.33 \times 10^{2}$ Pa·sec is greater than that of unexposed sample 25 of the conventional bottom type SVMR multi-layered film. Also, Hin of the samples 26–37 is lower than that of the sample 25. Particularly, in this example, because applicable exposure gas pressure of oxygen is wide, a large margin in the manufacturing process can be expected resulting in an easier manufacturing process.

FIFTH EXAMPLE

As for a fifth example, various samples of the top type SVMR multi-layered film with a nonmagnetic spacer layer or a Cu layer were fabricated. These Cu layers of the samples had different entire thicknesses with each other and their surfaces were exposed to an oxygen-contained atmosphere. For a comparison, samples of a conventional top type SVMR multi-layered film with a Cu layer not exposed to an oxygen-contained atmosphere were fabricated. The layer structure of these samples was Si/Al₂O₃/NiCr(5 nm)/NiFe(1.5 nm)/Ta(0.2 nm)/NiFe(1.5 nm)/CoFe(1 nm)/Cu//CoFe(2.5 nm)/Ru(0.8 nm)/CoFe(1.5 nm)/PtMn(15 nm)/Ta(3 nm). The mark of "//" indicates a position of the oxygen exposure. The multi-layered structure of NiFe/Ta/NiFe/CoFe is the free layer. An annealing process was performed in three steps of an annealing for keeping 270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer. Oxygen-exposure conditions were $5.32 \times 10^{-3}$ Pa·sec for 10 seconds.

A sheet resistance Rs, a change in resistance ΔRs, a ferromagnetic coupling Hin and a coercive force Hc were measured with respect to these samples, and an MR ratio MR was calculated from MR (%)=100×ΔRs(Ω/□)/Rs(Ω/□). The results are indicated in Table 5, and FIGS. 12 and 13.

TABLE 5

| Sample No. | O₂ Exposure of Cu layer | Thickness to O₂ exposure surface (nm) | Whole thickness of Cu layer (nm) | MR (%) | ΔRs (Ω/□) | Rs (Ω/□) | Hin (A/m) | Hc (A/m) |
|---|---|---|---|---|---|---|---|---|
| 38 | No | — | 2.1 | 12.1 | 1.85 | 15.3 | 624.1 | 63.2 |
| 39 | Surface | 2.5// | 2.5 | 12.9 | 1.68 | 13.1 | 1145.5 | 71.1 |
| 40 | Surface | 2.3// | 2.3 | 13.2 | 1.83 | 13.9 | 1121.8 | 63.2 |
| 41 | Surface | 2.1// | 2.1 | 13.5 | 2.00 | 14.8 | 379.2 | 86.9 |
| 42 | Surface | 2.0// | 2.0 | 13.4 | 2.09 | 15.5 | −110.6 | 102.7 |
| 43 | Surface | 1.9// | 1.9 | 13.3 | 2.15 | 16.2 | −268.6 | 94.8 |
| 44 | Surface | 1.8// | 1.8 | 13.7 | 2.25 | 16.4 | 450.3 | 71.1 |
| 45 | Surface | 1.7// | 1.7 | 13.8 | 2.30 | 16.7 | 2401.6 | 63.2 |
| 46 | Surface | 1.6// | 1.6 | 13.7 | 2.35 | 17.1 | 5293.0 | 55.3 |

Figure 12:
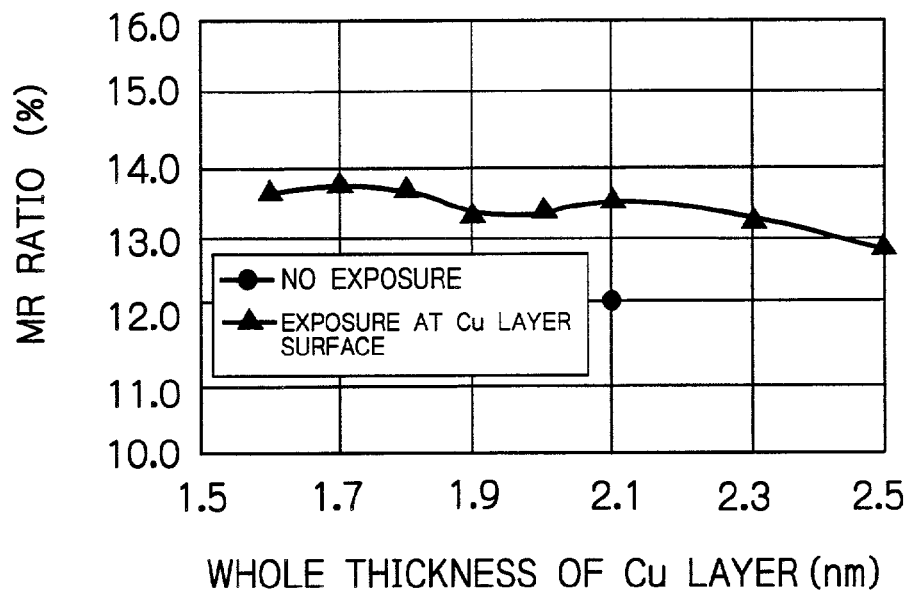
FIG. 12 shows a graph illustrating a characteristics of an MR ratio with respect to an entire thickness of a Cu layer in a fifth example.
Figure 13:
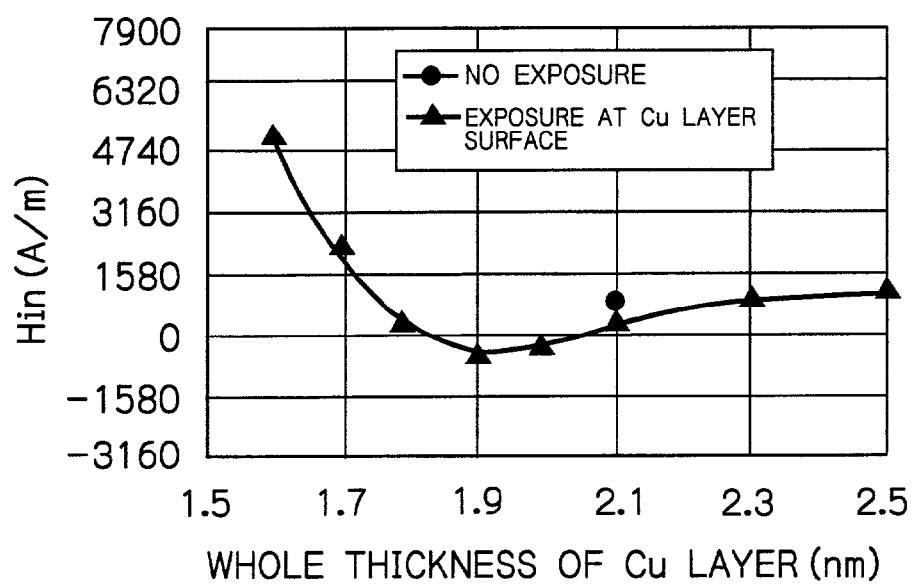
FIG. 13 shows a graph illustrating a characteristics of a Hin with respect to an entire thickness of a Cu layer in the fifth example.

As will be noted from Table 5, and FIGS. 12 and 13, the MR ratio of the oxygen-exposed samples 39–46 is greater than that of an unexposed sample 38 of the conventional top type SVMR multi-layered film. Also, as will be apparent from a comparison of the sample 38 with the sample 41, if the entire thickness of the Cu layer is the same with each other, Hin is reduced in case of oxygen exposure. It is possible to decrease Hin by appropriately selecting the entire thickness of the Cu layer.

SIXTH EXAMPLE

As for a sixth example, various samples of the top type SVMR multi-layered film with a nonmagnetic spacer layer or a Cu layer were fabricated. These Cu layers of the samples had the same entire thickness. Each Cu layer was deposited halfway to various thicknesses, the halfway surface was exposed to an oxygen-contained atmosphere, and then the remaining Cu layer was deposited. For a comparison, samples of a conventional top type SVMR multi-layered film with a Cu layer not exposed to an oxygen-contained atmosphere were fabricated. The layer structure of these samples was Si/Al₂O₃/NiCr(5 nm)/NiFe(1.5 nm)/Ta(0.2 nm)/NiFe(1 nm)/Cu(x nm)//Cu(2.1−x nm)/CoFe(2.5 nm)/Ru(0.8 nm)/CoFe(1.5 nm)/PtMn(15 nm)/Ta(3 nm). The mark of "//" indicates a position of the oxygen exposure. The multi-layered structure of NiFe/Ta/

NiFe/CoFe is the free layer. An annealing process was performed in three steps of an annealing for keeping 270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer. Oxygen-exposure conditions were $5.32 \times 10^{-3}$ Pa·sec for 10 seconds.

A sheet resistance Rs, a change in resistance ΔRs, a ferromagnetic coupling Hin and a coercive force Hc were measured with respect to these samples, and an MR ratio MR was calculated from MR (%)=100×ΔRs (Ω/□)/Rs (Ω/□). The results are indicated in Table 6, and FIGS. 14 and 15.

SEVENTH EXAMPLE

As for a seventh example, various samples of the top type SVMR multi-layered film with a magnetic spacer layer or a Cu layer were fabricated. These Cu layers of the samples had the same entire thickness (2.1 nm) and oxygen-exposure conditions at the surfaces of the Cu layers were different with each other. For a comparison, a sample of a conventional top type SVMR multi-layered film with a Cu layer not exposed to an oxygen-contained atmosphere were fabricated. The layer structure of these samples was Si/Al$_2$O$_3$/NiCr(5 nm)/NiFe(1.5 nm)/Ta(0.2 nm)/NiFe(1 nm)/CoFe(1.5 nm)/Cu(2.1 nm)//CoFe(2.5 nm)/Ru(0.8 nm)/CoFe(1.5 nm)/PtMn(15 nm)/Ta(3 nm). The mark of "//" indicates a position of the oxygen exposure. The multi-layered structure of NiFe/Ta/NiFe/CoFe is the free layer. An annealing process was performed in three steps of an annealing for keeping

TABLE 6

| Sample No. | O$_2$ Exposure of Cu layer | Thickness to O$_2$ exposure surface (nm) | Whole thickness of Cu layer (nm) | MR (%) | ΔRs (Ω/□) | Rs (Ω/□) | Hin (A/m) | Hc (A/m) |
|---|---|---|---|---|---|---|---|---|
| 47 | No      | —   | 2.1 | 12.5 | 1.89 | 15.1 | 537.2  | 55.3 |
| 48 | Halfway | 0.1 | 2.1 | 4.2  | 0.81 | 19.1 | 3096.8 | 86.9 |
| 49 | Halfway | 0.3 | 2.1 | 11.3 | 1.74 | 15.3 | 3191.6 | 55.3 |
| 50 | Halfway | 0.5 | 2.1 | 13.9 | 2.02 | 14.5 | 624.1  | 63.2 |
| 51 | Halfway | 0.6 | 2.1 | 13.9 | 2.03 | 14.7 | 165.9  | 63.2 |
| 52 | Halfway | 0.7 | 2.1 | 13.8 | 2.03 | 14.7 | −79.0  | 71.1 |
| 53 | Halfway | 0.9 | 2.1 | 13.8 | 2.03 | 14.7 | 86.9   | 63.2 |
| 54 | Halfway | 1.5 | 2.1 | 13.8 | 2.03 | 14.7 | 142.2  | 55.3 |
| 55 | Halfway | 2.1 | 2.1 | 13.8 | 2.05 | 14.8 | 173.8  | 47.4 |

Figure 14:
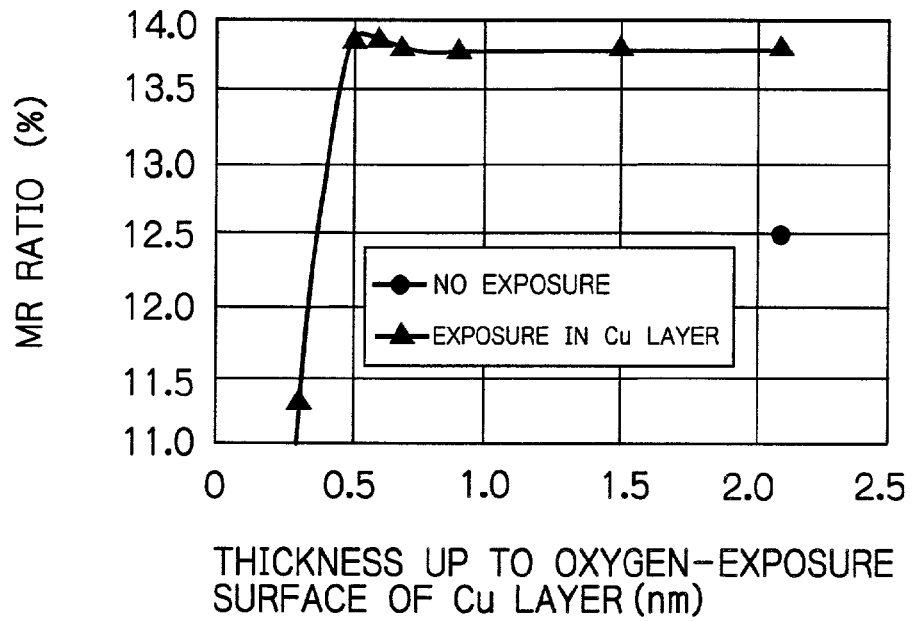
FIG. 14 shows a graph illustrating a characteristics of an MR ratio with respect to a thickness to an oxygen-exposure surface of a Cu layer in a sixth example.
Figure 15:
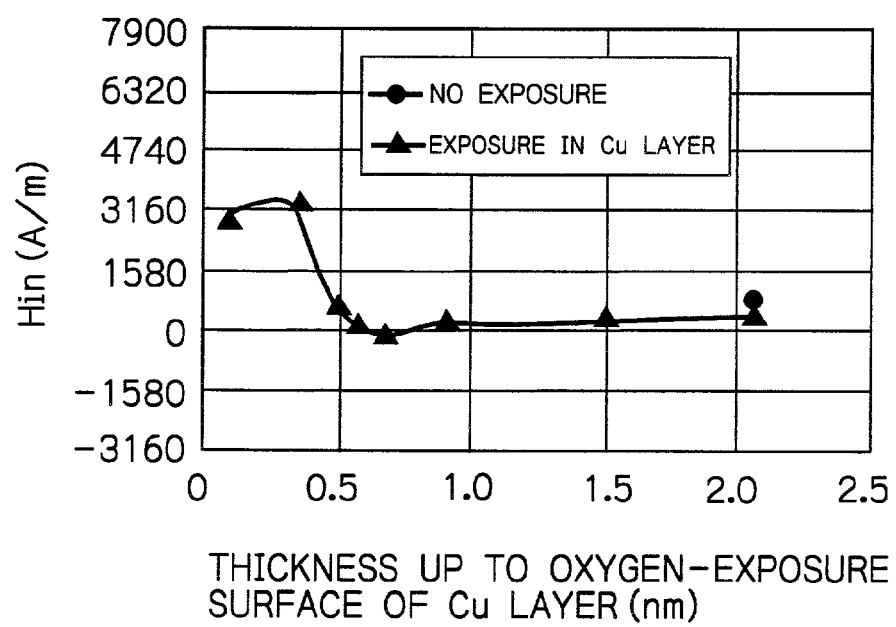
FIG. 15 shows a graph illustrating a characteristics of a Hin with respect to a thickness to an oxygen-exposure surface of a Cu layer in the sixth example.

As will be noted from Table 6, and FIGS. 14 and 15, the MR ratio and Hin change depending upon the thickness to the halfway surface exposed to an oxygen-contained atmosphere in the Cu layer. The MR ratio of the samples 50–55 that have thicknesses to the halfway surface exposed to an oxygen-contained atmosphere of 0.5 nm or more is greater than that of an unexposed sample 47 of the conventional top type SVMR multi-layered film. Also, Hin of the samples 51–55 that have thicknesses to the halfway surface exposed to an oxygen-contained atmosphere of 0.6–2.1 nm is reduced. It is possible to increase the MR ratio and to decrease Hin by appropriately selecting the thickness to the halfway surface exposed to an oxygen-contained atmosphere in the Cu layer.

270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer.

A sheet resistance Rs, a change in resistance ΔRs, a ferromagnetic coupling Hin and a coercive force Hc were measured with respect to these samples, and an MR ratio MR was calculated from MR (%)=100×ΔRs (Ω/□)/Rs (Ω/□). The results are indicated in Table 7 and FIG. 16.

TABLE 7

| | O$_2$ exposure conditions | | | | | | | |
|---|---|---|---|---|---|---|---|---|
| Sample No. | Pressure (mPa) | Time (seconds) | Exposure amount (Pa · sec) | MR (%) | ΔRs (Ω/□) | Rs (Ω/□) | Hin (A/m) | Hc (A/m) |
| 56 | —    | —  | 0          | 12.5 | 1.89 | 15.1 | 537.2 | 63.2 |
| 57 | 2.66 | 10 | 2.66E − 02 | 13.6 | 2.04 | 15.0 | 158.0 | 71.1 |
| 58 | 5.32 | 10 | 5.32E − 02 | 13.8 | 2.05 | 14.8 | 173.8 | 63.2 |
| 59 | 79.8 | 10 | 7.98E − 01 | 13.8 | 2.03 | 14.7 | 142.2 | 63.2 |
| 60 | 678.3| 10 | 67.83E − 01| 13.8 | 2.01 | 14.6 | 292.3 | 55.3 |
| 61 | 6650 | 10 | 6.65E + 01 | 13.8 | 2.01 | 14.6 | 252.8 | 71.1 |

Figure 16:
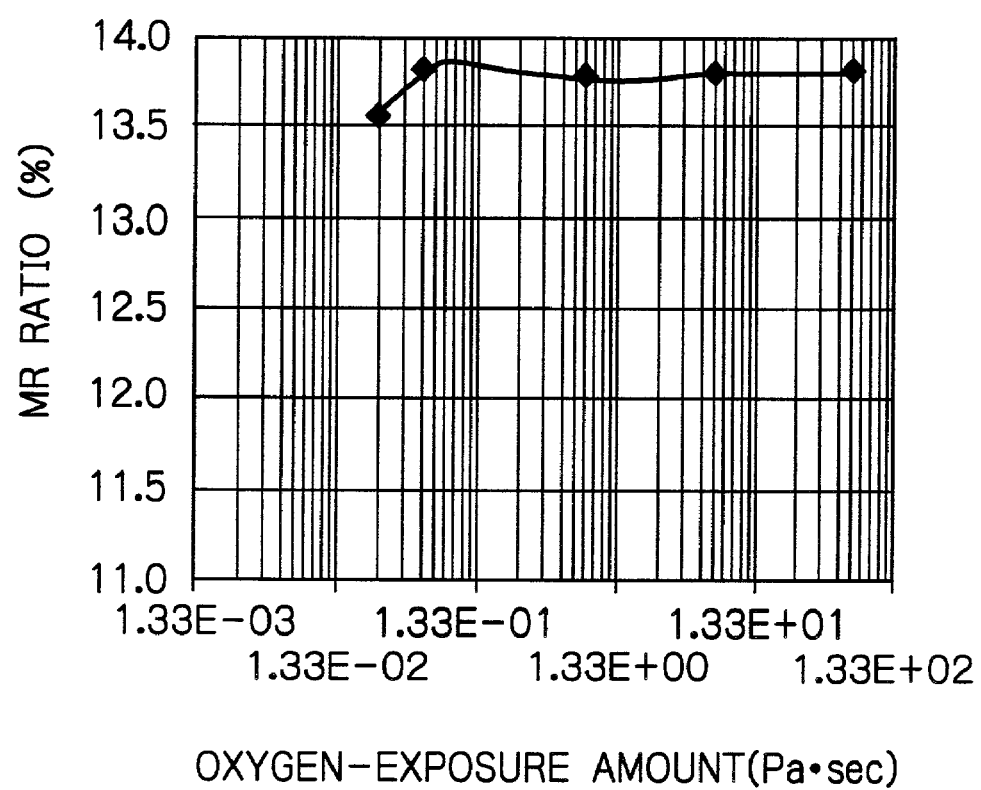
FIG. 16 shows a graph illustrating a characteristics of an MR ratio with respect to an oxygen-exposure amount in a seventh example.

As will be noted from Table 7 and FIG. 16, the MR ratio of the samples 57–61 that were exposed to an oxygen-contained atmosphere under the conditions of $2.66 \times 10^{-2}$ to $6.65 \times 10$ Pa·sec is greater than that of unexposed sample 56 of the conventional top type SVMR multi-layered film. Also, Hin of the samples 57–61 is lower than that of the sample 56. Particularly, in this example, because applicable exposure gas pressure of oxygen is wide, a large margin in the manufacturing process can be expected resulting in any easier manufacturing process.

EIGHTH EXAMPLE

As for an eighth example, various samples of the bottom type SVMR multi-layered film with a nonmagnetic spacer layer or a Cu layer were fabricated. These Cu layers of the samples had the same entire thickness (1.9 nm) and kinds of exposure gas at the surfaces of the Cu layers were different with each other. For a comparison, a sample of a conventional bottom type SVMR multi-layered film with a Cu layer not exposed to an oxygen-contained atmosphere were fabricated. The layer structure of these samples was Si/Al$_2$O$_3$/NiCr(4 nm)/PtMn(13 nm)/CoFe(1.5 nm)/Ru(0.8 nm)/CoFe(2 nm)/Cu(1.9 nm)//CoFe(1 nm)/NiFe(2 nm)/Ru(0.5 nm)/Ta(2 nm). The mark of "//" indicates a position of the oxygen exposure. The multi-layered structure of NiFe/Ta/NiFe/CoFe is the free layer. An annealing process was performed in three steps of an annealing for keeping 270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer. Oxygen-exposure conditions were $5.32 \times 10^{-3}$ Pa·sec for 10 seconds.

A sheet resistance Rs, a change in resistance ΔRs, a ferromagnetic coupling Hin and a coercive force Hc were measured with respect to these samples, and an MR ratio MR was calculated from MR (%)=100×ΔRs(Ω/□)/Rs(Ω/□). The results are indicated in Table 8.

TABLE 8

| Sample No. | Exposure gas | MR % | ΔRs (Ω/□) | Rs (Ω/□) | Hin (A/m) | Hc (A/m) |
| --- | --- | --- | --- | --- | --- | --- |
| 25 | — | 13.8 | 2.51 | 18.2 | 1587.9 | 55.3 |
| 30 | O$_2$ | 15.1 | 2.63 | 17.4 | 979.6 | 71.1 |
| 62 | Ar + O$_2$ | 15.3 | 2.67 | 17.4 | 1169.2 | 126.4 |
| 63 | Ne + O$_2$ | 15.2 | 2.63 | 17.3 | 861.1 | 79.0 |
| 64 | Kr + O$_2$ | 15.1 | 2.63 | 17.4 | 845.3 | 86.9 |
| 65 | Xe + O$_2$ | 15.3 | 2.63 | 17.2 | 813.7 | 94.8 |
| 66 | N$_2$ + O$_2$ | 14.8 | 2.60 | 17.6 | 1169.2 | 126.4 |

As will be noted from Table 8, the sample 30 that was exposed to an oxygen gas, the samples 62–65 that were exposed to a mixed gas of oxygen and Ne, Ar, Kr or Xe, and the sample 66 that was exposed to a mixed gas of oxygen and nitrogen have greater MR ratios and lower Hin than those of the unexposed sample 25 of the conventional top type SVMR multi-layered film.

NINTH EXAMPLE

As for a ninth example, various samples of the bottom type SVMR multi-layered film with an anti-ferromagnetic layer made of different kinds of anti-ferromagnetic material were fabricated. Each sample has a nonmagnetic spacer layer or a Cu layer exposed to an oxygen-contained atmosphere. For a comparison, samples of a conventional bottom type SVMR multi-layered film each having an anti-ferromagnetic layer made of different kinds of anti-ferromagnetic material and a Cu layer not exposed to an oxygen-contained atmosphere were fabricated. A layer structure of these samples was Si/Al$_2$O$_3$/NiCr(4 nm)/anti-ferromagnetic layer/CoFe(1.5 nm)/Ru(0.8 nm)/CoFe(2 nm)/Cu(2.1 nm)//CoFe(1 nm)/NiFe(2 nm)/Ru(0.5 nm)/Ta(2 nm). The mark of "//" indicates a position of the oxygen exposure. An annealing process was performed in three steps of an annealing for keeping 270° C. for 10 minutes under application of a magnetic field of 79 kA/m in a direction along the magnetization direction of the free layer, an annealing for keeping 270° C. for 3 hours under application of a magnetic field of 632 kA/m in a direction along the magnetization direction of the pinned layer, and an annealing for keeping 210° C. for 2 hours under application of a magnetic field of 15.8 kA/m in a direction along the magnetization direction of the free layer. Oxygen-exposure conditions were $5.32 \times 10^{-3}$ Pa·sec for 10 seconds.

A sheet resistance Rs, a change in resistance ΔRs, a ferromagnetic coupling Hin and a coercive force Hc were measured with respect to these samples, and an MR ratio MR was calculated MR (%)=100×ΔRs(Ω/□)/Rs(Ω/□). The results are indicated in Table 9.

TABLE 9

| Sample No. | Anti-ferromagnetic layer | O$_2$ Exposure of Cu layer | MR (%) | ΔRs (Ω/□) | Rs (Ω/□) | Hin (A/m) | Hc (A/m) |
| --- | --- | --- | --- | --- | --- | --- | --- |
| 2 | PtMn | No | 13.4 | 2.29 | 17.1 | 1019.1 | 55.3 |
| 7 | PtMn | Yes | 14.7 | 2.41 | 16.4 | 592.5 | 94.8 |
| 67 | RuRhMn | No | 12.5 | 2.11 | 16.9 | 1358.8 | 79.0 |
| 68 | RuRhMn | Yes | 14.1 | 2.27 | 16.1 | 726.8 | 150.1 |
| 69 | NiO | No | 11.3 | 2.27 | 20.1 | 4431.9 | 647.8 |
| 70 | NiO | Yes | 11.0 | 2.18 | 19.8 | 1240.3 | 884.8 |
| 71 | α-Fe$_2$O$_3$ | No | 10.5 | 2.25 | 21.4 | 5419.4 | 726.8 |
| 72 | α-Fe$_2$O$_3$ | Yes | 9.9 | 2.07 | 20.9 | 1840.7 | 1058.6 |

As will be noted from Table 9, in the samples 2, 7, 67 and 68 that used a conductive anti-ferromagnetic material such as PtMn or RuRhMn for the anti-ferromagnetic layer, the samples 7 and 68 with the oxygen exposed surface of the Cu layer have greater MR ratios and lower Hin than those of the unexposed samples 2 and 67. Also, in the samples 69–72 that used a nonconductive anti-ferromagnetic material such as NiO or α-Fe$_2$O$_3$ as for the anti-ferromagnetic layer, the samples 70 and 72 with the oxygen exposed surface of the Cu layer have lower Hin than those of the unexposed samples 69 and 72. However, in the latter case, the samples 70 and 72 with the oxygen exposed surface of the Cu layer do not have greater MR ratio than those of the unexposed samples 69 and 72. It is considered that when the anti-ferromagnetic layer is made of an insulated anti-ferromagnetic material such as NiO or α-Fe$_2$O$_3$, an wettability between the anti-ferromagnetic layer and the ferromagnetic layer of the pinned layer becomes poor, and therefore crystallization and diameters in crystals of the MR multi-layered film would be seriously affected. Thus, in this case, even if its Cu layer is exposed to oxygen, a sufficient effect therefrom cannot be expected. Contrary to this, when the anti-ferromagnetic layer is made of an electrically conductive anti-ferromagnetic material such as NiMn or RuRhMn, a relatively good wettability will be obtained between this anti-ferromagnetic layer and the ferromagnetic layer of the pinned layer. As a result, diameters in crystals of the MR multi-layered film will become relatively large and therefore the MR ratio will increase.

Although the aforementioned embodiments and examples concern the SVMR sensors, it is apparent that the present invention can be applied to other GMR sensors and to a TMR sensor.

Many widely different embodiments of the present invention may be constructed without departing from the spirit and scope of the present invention. It should be understood that the present invention is not limited to the specific embodiments described in the specification, except as defined in the appended claims.

The invention claimed is:

1. A manufacturing method of a magnetoresistive effect sensor comprising the steps of:

stacking an anti-ferromagnetic layer made of an electrically conductive anti-ferromagnetic material;

stacking a pinned layer on said anti-ferromagnetic layer;

stacking a nonmagnetic spacer layer on said pinned layer;

exposing a surface of said nonmagnetic spacer layer to an atmosphere of a mixed gas containing oxygen gas and argon gas containing an exposure amount of the oxygen in a range from $1.33 \times 10^{-3}$ to $1.33 \times 10^2$ Pa·sec one or more times to decrease a roughness in atomic level at an interface between said nonmagnetic spacer layer and a free layer for increasing MR ratio and reducing ferromagnetic coupling (Hin), an exposure amount of the oxygen being in a range from $1.33 \times 10^{-3}$ to $1.33 \times 10^2$ Pa·sec;

stacking said free layer on said nonmagnetic spacer layer, a magnetization direction of said free layer being free depending upon a magnetic filed applied thereto; and providing said pinned layer a magnetization direction fixed by an exchange coupling between said anti-ferromagnetic layer and said pinned layer.

2. The method as claimed in claim 1, wherein said stacking step of a pinned layer includes stacking a first ferromagnetic layer, stacking a nonmagnetic layer on said first ferromagnetic layer, and stacking a second ferromagnetic layer on said nonmagnetic layer.

3. A manufacturing method of a thin-film magnetic head with a magnetoresistive effect sensor for reproducing magnetic information, said manufacturing method including a sensor fabrication method comprising the steps of:

stacking an anti-ferromagnetic layer made of an electrically conductive anti-ferromagnetic material;

stacking a pinned layer on said anti-ferromagnetic layer;

stacking a nonmagnetic spacer layer formed of a single metal on said pinned layer;

exposing a surface of said nonmagnetic spacer layer to an atmosphere containing oxygen gas and argon gas containing an exposure amount of the oxygen in a range from $1.33 \times 10^{-3}$ to $1.33 \times 10^2$ Pa·sec one or more times to decrease a roughness in atomic level at an interface between said nonmagnetic spacer layer and a free layer for increasing MR ratio and reducing ferromagnetic coupling (Hin), an exposure amount of the oxygen being in a range from $1.33 \times 10^{-3}$ to $1.33 \times 10^2$ Pa·sec;

stacking said free layer on said nonmagnetic spacer layer, a magnetization direction of said free layer being free depending upon a magnetic filed applied thereto; and providing said pinned layer a magnetization direction fixed by an exchange coupling between said anti-ferromagnetic layer and said pinned layer.

* * * * *